(12) United States Patent  (10) Patent No.: US 8,203,421 B2
Kosowsky et al.  (45) Date of Patent: Jun. 19, 2012

(54) SUBSTRATE DEVICE OR PACKAGE USING EMBEDDED LAYER OF VOLTAGE SWITCHABLE DIELECTRIC MATERIAL IN A VERTICAL SWITCHING CONFIGURATION

(75) Inventors: Lex Kosowsky, San Jose, CA (US); Robert Fleming, San Jose, CA (US); Bhret Graydon, San Jose, CA (US)

(73) Assignee: Shocking Technologies, Inc., San Jose, CA (US)

( * ) Notice: Subject to any disclaimer, the term of this patent is extended or adjusted under 35 U.S.C. 154(b) by 364 days.

(21) Appl. No.: 12/417,589

(22) Filed: Apr. 2, 2009

(65) Prior Publication Data

US 2009/0256669 A1   Oct. 15, 2009

Related U.S. Application Data

(60) Provisional application No. 61/044,883, filed on Apr. 14, 2008.

(51) Int. Cl.
*H01C 7/10* (2006.01)
(52) U.S. Cl. .......................................................... 338/21
(58) Field of Classification Search .................... 338/20, 338/21
See application file for complete search history.

(56) References Cited

U.S. PATENT DOCUMENTS

| 3,347,724 A | 10/1967 | Schneble, Jr. et al. |
| 3,685,026 A | 8/1972 | Wakabayashi et al. |
| 3,685,028 A | 8/1972 | Wakabayashi et al. |
| 3,723,635 A | 3/1973 | Smith |
| 3,808,576 A | 4/1974 | Castonguay et al. |
| 3,926,916 A | 12/1975 | Mastrangelo |
| 3,977,957 A | 8/1976 | Kosowsky et al. |
| 4,113,899 A | 9/1978 | Henry et al. |
| 4,133,735 A | 1/1979 | Afromowitz et al. |
| 4,252,692 A | 2/1981 | Taylor et al. |
| 4,331,948 A | 5/1982 | Malinaric et al. |
| 4,359,414 A | 11/1982 | Mastrangelo |
| 4,405,432 A | 9/1983 | Kosowsky |
| 4,439,809 A | 3/1984 | Weight et al. |
| 4,506,285 A | 3/1985 | Einzinger |
| 4,591,411 A | 5/1986 | Reimann |
| 4,642,160 A | 2/1987 | Burgess |
| 4,702,860 A | 10/1987 | Kinderov et al. |

(Continued)

FOREIGN PATENT DOCUMENTS

CH    663491 A5    12/1987

(Continued)

OTHER PUBLICATIONS

U.S. Appl. No. 11/562,222, filed Nov. 21, 2006, Kosowsky.

(Continued)

*Primary Examiner* — James Harvey
(74) *Attorney, Agent, or Firm* — Mahamedi Paradice Kreisman LLP

(57) ABSTRACT

A substrate device includes an embedded layer of VSD material that overlays a conductive element or layer to provide a ground. An electrode, connected to circuit elements that are to be protected, extends into the thickness of the substrate to make contact with the VSD layer. When the circuit elements are operated under normal voltages, the VSD layer is dielectric and not connected to ground. When a transient electrical event occurs on the circuit elements, the VSD layer switches instantly to a conductive state, so that the first electrode is connected to ground.

13 Claims, 4 Drawing Sheets

U.S. PATENT DOCUMENTS

| | | | |
|---|---|---|---|
| 4,726,877 A | 2/1988 | Fryd et al. |
| 4,726,991 A | 2/1988 | Hyatt et al. |
| 4,799,128 A | 1/1989 | Chen |
| 4,888,574 A | 12/1989 | Rice et al. |
| 4,892,776 A | 1/1990 | Rice |
| 4,918,033 A | 4/1990 | Bartha et al. |
| 4,928,199 A | 5/1990 | Diaz et al. |
| 4,935,584 A | 6/1990 | Boggs |
| 4,977,357 A | 12/1990 | Shrier |
| 4,992,333 A | 2/1991 | Hyatt |
| 4,996,945 A | 3/1991 | Dix, Jr. |
| 5,068,634 A | 11/1991 | Shrier |
| 5,092,032 A | 3/1992 | Murakami |
| 5,095,626 A | 3/1992 | Kitamura et al. |
| 5,099,380 A | 3/1992 | Childers et al. |
| 5,126,915 A | 6/1992 | Pepin et al. |
| 5,142,263 A | 8/1992 | Childers et al. |
| 5,148,355 A | 9/1992 | Lowe et al. |
| 5,183,698 A | 2/1993 | Stephenson et al. |
| 5,189,387 A | 2/1993 | Childers et al. |
| 5,246,388 A | 9/1993 | Collins et al. |
| 5,248,517 A | 9/1993 | Shrier et al. |
| 5,252,195 A | 10/1993 | Kobayashi et al. |
| 5,260,848 A | 11/1993 | Childers |
| 5,262,754 A | 11/1993 | Collins |
| 5,278,535 A | 1/1994 | Xu et al. |
| 5,282,312 A | 2/1994 | DiStefano et al. |
| 5,294,374 A | 3/1994 | Martinez et al. |
| 5,295,297 A | 3/1994 | Kitamura et al. |
| 5,300,208 A | 4/1994 | Angelopoulos et al. |
| 5,317,801 A | 6/1994 | Tanaka et al. |
| 5,340,641 A | 8/1994 | Xu |
| 5,347,258 A | 9/1994 | Howard et al. |
| 5,354,712 A | 10/1994 | Ho et al. |
| 5,367,764 A | 11/1994 | DiStefano et al. |
| 5,378,858 A | 1/1995 | Bruckner et al. |
| 5,380,679 A | 1/1995 | Kano |
| 5,393,597 A | 2/1995 | Childers et al. |
| 5,403,208 A | 4/1995 | Felcman et al. |
| 5,404,637 A | 4/1995 | Kawakami |
| 5,413,694 A | 5/1995 | Dixon et al. |
| 5,416,662 A | 5/1995 | Kurasawa et al. |
| 5,440,075 A | 8/1995 | Kawakita et al. |
| 5,444,593 A | 8/1995 | Allina |
| 5,476,471 A | 12/1995 | Shifrin et al. |
| 5,481,795 A | 1/1996 | Hatakeyama et al. |
| 5,483,407 A | 1/1996 | Anastasio et al. |
| 5,487,218 A | 1/1996 | Bhatt et al. |
| 5,493,146 A | 2/1996 | Pramanik et al. |
| 5,501,350 A | 3/1996 | Yoshida et al. |
| 5,502,889 A | 4/1996 | Casson et al. |
| 5,510,629 A | 4/1996 | Karpovich et al. |
| 5,550,400 A | 8/1996 | Takagi et al. |
| 5,557,136 A | 9/1996 | Gordon et al. |
| 5,654,564 A | 8/1997 | Mohsen |
| 5,669,381 A | 9/1997 | Hyatt |
| 5,685,070 A | 11/1997 | Alpaugh et al. |
| 5,708,298 A | 1/1998 | Masayuki et al. |
| 5,714,794 A | 2/1998 | Tsuyama et al. |
| 5,734,188 A | 3/1998 | Murata et al. |
| 5,744,759 A | 4/1998 | Ameen et al. |
| 5,781,395 A | 7/1998 | Hyatt |
| 5,802,714 A | 9/1998 | Kobayashi et al. |
| 5,807,509 A | 9/1998 | Shrier et al. |
| 5,808,351 A | 9/1998 | Nathan et al. |
| 5,834,160 A | 11/1998 | Ferry et al. |
| 5,834,824 A | 11/1998 | Shepherd et al. |
| 5,834,893 A | 11/1998 | Bulovic et al. |
| 5,848,467 A | 12/1998 | Khandros et al. |
| 5,856,910 A | 1/1999 | Yurchenco et al. |
| 5,865,934 A | 2/1999 | Yamamoto et al. |
| 5,869,869 A | 2/1999 | Hively |
| 5,874,902 A | 2/1999 | Heinrich et al. |
| 5,906,042 A | 5/1999 | Lan et al. |
| 5,910,685 A | 6/1999 | Watanabe et al. |
| 5,926,951 A | 7/1999 | Khandros et al. |
| 5,940,683 A | 8/1999 | Holm et al. |
| 5,946,555 A | 8/1999 | Crumly et al. |
| 5,955,762 A | 9/1999 | Hively |
| 5,956,612 A | 9/1999 | Elliott et al. |
| 5,962,815 A | 10/1999 | Lan et al. |
| 5,970,321 A | 10/1999 | Hively |
| 5,972,192 A | 10/1999 | Dubin et al. |
| 5,977,489 A | 11/1999 | Crotzer et al. |
| 5,986,315 A | 11/1999 | Bost et al. |
| 6,013,358 A | 1/2000 | Winnett et al. |
| 6,023,028 A | 2/2000 | Neuhalfen |
| 6,064,094 A | 5/2000 | Intrater et al. |
| 6,108,184 A | 8/2000 | Minervini et al. |
| 6,130,459 A | 10/2000 | Intrater |
| 6,160,695 A | 12/2000 | Winnett et al. |
| 6,172,590 B1 | 1/2001 | Shrier et al. |
| 6,184,280 B1 | 2/2001 | Shibuta |
| 6,191,928 B1 | 2/2001 | Rector et al. |
| 6,198,392 B1 | 3/2001 | Hahn et al. |
| 6,211,554 B1 | 4/2001 | Whitney et al. |
| 6,239,687 B1 | 5/2001 | Shrier et al. |
| 6,251,513 B1 | 6/2001 | Rector et al. |
| 6,310,752 B1 | 10/2001 | Shrier et al. |
| 6,316,734 B1 | 11/2001 | Yang |
| 6,340,789 B1 | 1/2002 | Petritsch et al. |
| 6,351,011 B1 | 2/2002 | Whitney et al. |
| 6,373,719 B1 | 4/2002 | Behling et al. |
| 6,407,411 B1 | 6/2002 | Wojnarowski et al. |
| 6,433,394 B1 | 8/2002 | Intrater |
| 6,448,900 B1 | 9/2002 | Chen |
| 6,455,916 B1 | 9/2002 | Robinson |
| 6,512,458 B1 | 1/2003 | Kobayashi et al. |
| 6,522,237 B1 | 2/2003 | Ito et al. |
| 6,534,422 B1 | 3/2003 | Ichikawa et al. |
| 6,542,065 B2 | 4/2003 | Shrier et al. |
| 6,549,114 B2 | 4/2003 | Whitney et al. |
| 6,570,765 B2 | 5/2003 | Behling et al. |
| 6,593,597 B2 | 7/2003 | Sheu |
| 6,628,498 B2 | 9/2003 | Whitney et al. |
| 6,642,297 B1 | 11/2003 | Hyatt et al. |
| 6,657,532 B1 | 12/2003 | Shrier et al. |
| 6,693,508 B2 | 2/2004 | Whitney et al. |
| 6,741,217 B2 | 5/2004 | Toncich et al. |
| 6,781,506 B2 | 8/2004 | Schemenaur et al. |
| 6,797,145 B2 | 9/2004 | Kosowsky |
| 6,882,051 B2 | 4/2005 | Majumdar et al. |
| 6,911,676 B2 | 6/2005 | Yoo |
| 6,916,872 B2 | 7/2005 | Yadav et al. |
| 6,981,319 B2 | 1/2006 | Shrier |
| 7,034,652 B2 | 4/2006 | Whitney et al. |
| 7,049,926 B2 | 5/2006 | Shrier et al. |
| 7,053,468 B2 | 5/2006 | Lee |
| 7,064,353 B2 | 6/2006 | Bhat |
| 7,132,697 B2 | 11/2006 | Weimer et al. |
| 7,132,922 B2 | 11/2006 | Harris et al. |
| 7,141,184 B2 | 11/2006 | Chacko et al. |
| 7,173,288 B2 | 2/2007 | Lee et al. |
| 7,183,891 B2 | 2/2007 | Harris et al. |
| 7,202,770 B2 | 4/2007 | Harris et al. |
| 7,205,613 B2 | 4/2007 | Fjelstad et al. |
| 7,218,492 B2 | 5/2007 | Shrier |
| 7,320,762 B2 | 1/2008 | Greuter et al. |
| 7,417,194 B2 | 8/2008 | Shrier |
| 7,446,030 B2 | 11/2008 | Kosowsky |
| 7,528,467 B2 | 5/2009 | Lee |
| 7,793,236 B2 | 9/2010 | Kosowsky et al. |
| 7,998,370 B2 | 8/2011 | Hama et al. |
| 2001/0043141 A1 | 11/2001 | Tuttle |
| 2002/0061363 A1 | 5/2002 | Halas et al. |
| 2003/0008989 A1 | 1/2003 | Gore et al. |
| 2003/0010960 A1 | 1/2003 | Greuter et al. |
| 2003/0078332 A1 | 4/2003 | Dardi |
| 2003/0079910 A1 | 5/2003 | Kosowsky |
| 2003/0207978 A1 | 11/2003 | Yadav et al. |
| 2003/0218851 A1 | 11/2003 | Harris et al. |
| 2004/0063294 A1 | 4/2004 | Durocher et al. |
| 2004/0095658 A1 | 5/2004 | Buretea et al. |
| 2004/0154828 A1 | 8/2004 | Moller et al. |
| 2004/0160300 A1 | 8/2004 | Shrier |
| 2004/0211942 A1 | 10/2004 | Clark et al. |
| 2005/0026334 A1 | 2/2005 | Knall |

| | | | |
|---|---|---|---|
| 2005/0083163 | A1 | 4/2005 | Shrier |
| 2005/0106098 | A1 | 5/2005 | Tsang et al. |
| 2005/0208304 | A1 | 9/2005 | Collier et al. |
| 2005/0218380 | A1 | 10/2005 | Gramespacher et al. |
| 2005/0274455 | A1 | 12/2005 | Extrand |
| 2005/0274956 | A1 | 12/2005 | Bhat |
| 2006/0035081 | A1 | 2/2006 | Morita et al. |
| 2006/0060880 | A1 | 3/2006 | Lee et al. |
| 2006/0152334 | A1 | 7/2006 | Maercklein et al. |
| 2006/0167139 | A1 | 7/2006 | Nelson et al. |
| 2006/0181826 | A1 | 8/2006 | Dudnikov, Jr. et al. |
| 2006/0181827 | A1 | 8/2006 | Dudnikov, Jr. et al. |
| 2006/0199390 | A1 | 9/2006 | Dudnikov, Jr. et al. |
| 2006/0211837 | A1 | 9/2006 | Ko et al. |
| 2006/0291127 | A1 | 12/2006 | Kim et al. |
| 2007/0114640 | A1 | 5/2007 | Kosowsky |
| 2007/0116976 | A1 | 5/2007 | Tan et al. |
| 2007/0126018 | A1 | 6/2007 | Kosowsky |
| 2007/0139848 | A1 | 6/2007 | Harris et al. |
| 2007/0146941 | A1 | 6/2007 | Harris et al. |
| 2007/0208243 | A1 | 9/2007 | Gabriel et al. |
| 2008/0023675 | A1 | 1/2008 | Kosowsky |
| 2008/0029405 | A1 | 2/2008 | Kosowsky |
| 2008/0032049 | A1 | 2/2008 | Kosowsky |
| 2008/0035370 | A1 | 2/2008 | Kosowsky |
| 2008/0045770 | A1 | 2/2008 | Sigmund et al. |
| 2008/0073114 | A1 | 3/2008 | Kosowsky |
| 2008/0186053 | A1 | 8/2008 | Malekkhosravi et al. |
| 2008/0299298 | A1 | 12/2008 | Kim et al. |
| 2008/0313576 | A1 | 12/2008 | Kosowsky |
| 2009/0044970 | A1 | 2/2009 | Kosowsky |
| 2009/0050856 | A1 | 2/2009 | Kosowsky |
| 2009/0071368 | A1 | 3/2009 | Steingrover et al. |
| 2009/0114425 | A1 | 5/2009 | Lee et al. |
| 2009/0256669 | A1* | 10/2009 | Kosowsky et al. ............. 338/21 |
| 2010/0047535 | A1 | 2/2010 | Kosowsky et al. |
| 2010/0222462 | A1 | 9/2010 | Yamauchi et al. |
| 2010/0243302 | A1* | 9/2010 | Kosowsky et al. ............ 174/257 |

FOREIGN PATENT DOCUMENTS

| | | |
|---|---|---|
| DE | 3040784 A1 | 5/1982 |
| DE | 10115333 A1 | 1/2002 |
| DE | 102004049053 | 5/2005 |
| DE | 102006047377 | 4/2008 |
| EP | 1003229 A1 | 5/2000 |
| EP | 1 245 586 A2 | 10/2002 |
| EP | 0790758 | 11/2004 |
| EP | 1 580 809 A2 | 9/2005 |
| EP | 1542240 A2 | 6/2006 |
| EP | 1 857 871 A1 | 4/2007 |
| EP | 1 990 834 A2 | 11/2008 |
| JP | 56091464 A | 7/1981 |
| JP | 63 195275 A | 8/1988 |
| JP | 2000 062076 A | 2/2000 |
| WO | WO 88/00526 A1 | 1/1988 |
| WO | WO 89/06859 A2 | 7/1989 |
| WO | WO 96/02922 A2 | 2/1996 |
| WO | WO96/02924 A1 | 2/1996 |
| WO | WO 96/02944 A1 | 2/1996 |
| WO | WO97/26665 A1 | 7/1997 |
| WO | WO98/23018 A1 | 5/1998 |
| WO | WO99/24992 A1 | 5/1999 |
| WO | WO99/49525 A1 | 9/1999 |
| WO | WO 02/103085 A1 | 12/2002 |
| WO | WO 03/032335 A1 | 4/2003 |
| WO | WO 2005/100426 A1 | 10/2005 |
| WO | WO 2006/130366 A2 | 12/2006 |
| WO | WO 2007/062170 A2 | 5/2007 |
| WO | WO 2007/062171 A2 | 5/2007 |
| WO | WO 2008/016858 A1 | 2/2008 |
| WO | WO 2008/016859 A1 | 2/2008 |
| WO | WO 2008/024207 A1 | 2/2008 |
| WO | WO 2008/036984 A2 | 3/2008 |
| WO | WO 2008/153584 A1 | 12/2008 |
| WO | WO 2009/026299 A1 | 2/2009 |

OTHER PUBLICATIONS

U.S. Appl. No. 11/903,820, filed Sep. 24, 2007, Kosowsky et al.
U.S. Appl. No. 12/638,632, filed Dec. 15, 2009, Fleming et al.
U.S. Appl. No. 12/642,799, filed Dec. 19, 2009, Fleming et al.
U.S. Appl. No. 12/692,573, filed Jan. 22, 2010, Fleming et al.
U.S. Appl. No. 12/703,674, filed Feb. 10, 2010, Kosowsky et al.
U.S. Appl. No. 12/703,701, filed Feb. 10, 2010, Kosowsky et al.
U.S. Appl. No. 12/703,723, filed Feb. 10, 2010, Kosowsky et al.
U.S. Appl. No. 12/714,354, filed Feb. 26, 2010, Fleming et al.
U.S. Appl. No. 12/714,358, filed Feb. 26, 2010, Fleming et al.
U.S. Appl. No. 12/717,102, filed Mar. 3, 2010, Kosowsky et al.
U.S. Appl. No. 12/731,557, filed Mar. 25, 2010, Kosowsky.
Communication of Nov. 11, 2009 with Examination Report in European Patent Application No. 07 813 509.2 5 pages.
Communication of Nov. 23, 2009 with Supp European Search Report and Opinion, European Application No. 06 838 319.9 7 pages.
Communication pf Nov. 9, 2009 with Examination Report in European Patent Application No. 07 813 508.4, 5 pages.
Communication with Examination Report mailed Dec. 23, 2009 in European app. 06838276.1-2203, 6 pgs.
Fullerene Chemistry—Wikipedia, http://en.wikipedia.org/wiki/Fullerene/chemistry, 6 pages, printed Apr. 8, 2010.
International Preliminary Report on Patentability for International Application PCT/US07/079377 mailed Dec. 30, 2009, 8 pages.
International Preliminary Report on Patentability for International Application PCT/US2008/073603 mailed Mar. 4, 2010, 7 pages.
International Search Report, Written Opinion and Notice of Transmittal of Same mailed Apr. 16, 2010 for International Application PCT/US2009/062844 20 pages.
International Search Report and Written Opinion mailed Nov. 12, 2009 in International Application PCT/US2009/054062, 15 pages.
International Search Report, Written Opinion and Notice of Transmittal of Same mailed Apr. 20, 2010 for International Application PCT/US2009/059134 22 pages.
International Search Report and Written Opinion mailed Nov. 17, 2009 in International Application PCT/US2009/057209, 14 pages.
International Search Report, Written Opinion, and Notice of Transmittal of same mailed Mar. 18, 2010 for International Application PCT/US2010/021889 15 pages.
Levinson et al., "The Physics of metal oxide varistors," J. Applied Physics, 46(3): 1332-1341 (1975).
Non-Final Office Action dated Apr. 13, 2010 in U.S. Appl. No. 12/714,354, 17 pages.
Non-Final Office Action dated Apr. 14, 2010 in U.S. Appl. No. 12/714,358, 17 pages.
Non-Final Office Action mailed Apr. 20, 2010 in U.S. Appl. No. 11/829,946, 20 pages.
Notice of Allowance Jan. 14, 2010 U.S. Appl. No. 11/562,289 9pages.
U.S. Appl. No. 12/356,490, filed Jan. 20, 2009, Kosowsky.
U.S. Appl. No. 12/370,589, filed Feb. 12, 2009, Kosowsky.
U.S. Appl. No. 12/407,346, filed Mar. 19, 2009, Kosowsky.
Breton et al., "Mechanical properties of multiwall carbon nanotubes/epoxy composites: influence of network morphology," Carbon Elsevier UK, vol. 42, No. 5-6, pp. 1027-1030 (2004).
Celzard, A., et al., "Conduction Mechanisms in Some Graphite-polymer Composites: The Effect of a Direct-current Electric Field", Journal of Physics: Condensed Matter, 9 (1997) pp. 2225-2237.
Facchetti, Antonio, "Semiconductors for Organic Transistors", Materials Today, vol. 10, No. 3, pp. 28-37, (2007).
Granstrom et al., "laminated fabrication of polymeric photovoltaic diodes," Nature, vol. 395, pp. 257-260 (1998).
Guo et al., "Block Copolymer Modified Novolac Epoxy Resin," Polymer Physics, vol. 41, No. 17, pp. 1994-2003 (2003).
International Preliminary Report on Patentability in International Application PCT/US2007/074677, Feb. 3, 2009, 8 pages.
International Preliminary Report on Patentability for International Application PCT/US06/045291, ISA/US, mailed Mar. 24, 2009, 8 pages.
International Search Report and Written Opinion in International Application PCT/US2009/038429 mailed Aug. 18, 2009, 20 pgs.
International Search Report and Written Opinion in International Application PCT/US2007/079345, mailed Nov. 7, 2008, 25 pages.

International Search Report and Written Opinion of the International Searching Authority in International Application PCT/US2008/073603, US Patent Office, Nov. 17, 2008, 7 pages.

International Search Report and Written Opinion of the International Searching Authority in International Application PCT/US2007/074677, European Patent Office, Dec. 5, 2007, 13 pages.

International Search Report and Written Opinion of the International Searching Authority in International Application PCT/US2007/079377, European Patent Office, Mar. 7, 2008, 13 pages.

International Search Report and Written Opinion of the International Searching Authority in International Application PCT/US06/45292, United States Patent Office, Feb. 14, 2008, 10 pages.

International Search Report and Written Opinion of the International Searching Authority in International Application PCT/US06/45291, United States Patent Office, Mar. 5, 2008, 14 pages.

International Search Report and Written Opinion of the International Searching Authority in International Application PCT/US09/040384, European Patent Office, Jul. 2, 2009, 15 pages.

Modine, F.A. and Hyatt, H.M. "New Varistor Material", Journal of Applied Physics, 64 (8), Oct. 15, 1988, pp. 4229-4232.

Onoda et al., "Photoinduced Charge Transfer of Conducting Polymer Compositions," IEICE Trans. Electronics, vol. E81-C(7), pp. 1051-1056 (1998).

Raffaelle et al., "Nanomaterial Development for Polymeric Solar Cells," IEEE 4th World Conf on Photovoltaic energy Conversion, pp. 186-189 (2006).

Reese, Colin and Bao, Zhenan, "Organic Single-Crystal Field-Effect Transistors", Materials Today, vol. 10, No. 3, pp. 20-27, (2007).

Saunders et al., "Nanoparticle-polymer photovoltaic cells," Adv. Colloid Int. Sci., vol. 138, No. 1, pp. 1-23 (2007).

U.S. Appl. No. 12/820,897, filed Jun. 22, 2010, Kosowsky.
U.S. Appl. No. 12/820,939, filed Jun. 22, 2010, Kosowsky.
U.S. Appl. No. 12/820,956, filed Jun. 22, 2010, Kosowsky.
U.S. Appl. No. 12/832,022, filed Jul. 7, 2010, Kosowsky.
U.S. Appl. No. 12/832,033, filed Jul. 7, 2010, Kosowsky.
U.S. Appl. No. 12/832,040, filed Jul. 7, 2010, Kosowsky et al.
U.S. Appl. No. 12/834,273, filed Jul. 12, 2010, Kosowsy et al.
U.S. Appl. No. 12/834,296, filed Jul. 12, 2010, Kosowsky et al.

Examination Report for European Application 07813508.4-1218 mailed Jul. 2, 2010.

Examination Report for European Application 07813509.2-1218 mailed Jul. 2, 2010.

Examination Report for European Application 06838319.9 mailed May 7, 2010.

Extended European Search Report for European Application 10158080.1 mailed Jul. 1, 2010.

Non-Final Office Action mailed Jul. 20, 2010 in U.S. Appl. No. 11/562,222.

Notice of Allowance mailed Sep. 7, 2010 in U.S. Appl. No. 11/562,289.

Notice of Allowance mailed Jun. 21, 2010 in U.S. Appl. No. 11/860,530.

Office Action Issued Jul. 29, 2010 in Chinese Application No. 200780028607.9.

Translation of Office Action of Jul. 7, 2010 in Chinese Application 200680043524.2.

Translation of Office Action of Jul. 12, 2010 in Chinese Application 200780028617.2.

Non-Final Office Action mailed Feb. 29, 2012 in U.S. Appl. No. 12/607,952.

Office Action of Jan. 31, 2012 in Korean Patent Application 2010-7023158.

Final Office Action mailed Apr. 3, 2012 in U.S. Appl. No. 12/638,360.

Final Office Action mailed Apr. 11, 2012 in U.S. Appl. No. 11/562,222.

Gonjay et al., "Evaluation and identification of electrical and thermal conduction mechanisms in carbon nanotube/epoxy composites," Polymer, 47:2036-2045 (2006).

International Search Report, Written Opinion, Notice of Transmittal of same mailed Mar. 2, 2012 in PCT/US2010/058435.

International Search Report, Written Opinion, Notice of Transmittal of same mailed Mar. 5, 2012 in PCT/US2011/059659.

Non-Final Office Action mailed Apr. 3, 2012 in U.S. Appl. No. 12/820,897.

Non-Final Office Action mailed Mar. 28, 2012 in U.S. Appl. No. 12/834,296.

Non-Final Office Action mailed Mar. 15, 2012 in U.S. Appl. No. 12/370,589.

Non-Final Office Action mailed Feb. 23, 2012 in U.S. Appl. No. 12/820,956.

Search Report of Mar. 14, 2012 for Singapore Application 201105483.

Translation of Final Office Action of Feb. 28, 2012 in Japanese App. No. 2008-542453.

Translation of Office Action of Mar. 29, 2012 in Chinese App. No. 200680043467.8.

Translation of Office Action of Mar. 19, 2012 in Chinese App. No. 200780028607.9.

Translation of Office Action of Feb. 17, 2012 in Chinese App. No. 200780028617.2.

Written Opinion of Mar. 14, 2012 for Singapore Application 201105483.

* cited by examiner

SUBSTRATE DEVICE OR PACKAGE USING EMBEDDED LAYER OF VOLTAGE SWITCHABLE DIELECTRIC MATERIAL IN A VERTICAL SWITCHING CONFIGURATION

RELATED APPLICATIONS

This Application claims benefit of priority to Provisional U.S. Patent Application No. 61/044,883, filed Apr. 14, 2008; the aforementioned priority application being hereby incorporated by reference in its entirety.

FIELD OF THE INVENTION

Embodiments described herein pertain to substrate devices and packages that utilize voltage switchable dielectric material. In particular, embodiments described herein pertain to substrate devices and packages that embed layer(s) of voltage switchable dielectric material in a vertical switching configuration.

BACKGROUND

Voltage switchable dielectric (VSD) materials are known to be materials that are insulative at low voltages and conductive at higher voltages. These materials are typically composites comprising of conductive, semiconductive, and insulative particles in an insulative polymer matrix. These materials are used for transient protection of electronic devices, most notably electrostatic discharge protection (ESD) and electrical overstress (EOS). Generally, VSD material behaves as a dielectric, unless a characteristic voltage or voltage range is applied, in which case it behaves as a conductor. Various kinds of VSD material exist. Examples of voltage switchable dielectric materials are provided in references such as U.S. Pat. Nos. 4,977,357, 5,068,634, 5,099,380, 5,142,263, 5,189,387, 5,248,517, 5,807,509, WO 96/02924, and WO 97/26665, all of which are incorporated by reference herein.

VSD materials may be formed using various processes and materials or compositions. One conventional technique provides that a layer of polymer is filled with high levels of metal particles to very near the percolation threshold, typically more than 25% by volume. Semiconductor and/or insulator materials are then added to the mixture.

Another conventional technique provides for forming VSD material by mixing doped metal oxide powders, then sintering the powders to make particles with grain boundaries, and then adding the particles to a polymer matrix to above the percolation threshold.

Other techniques and compositions for forming VSD material are described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES.

DETAILED DESCRIPTION

Figure 1:
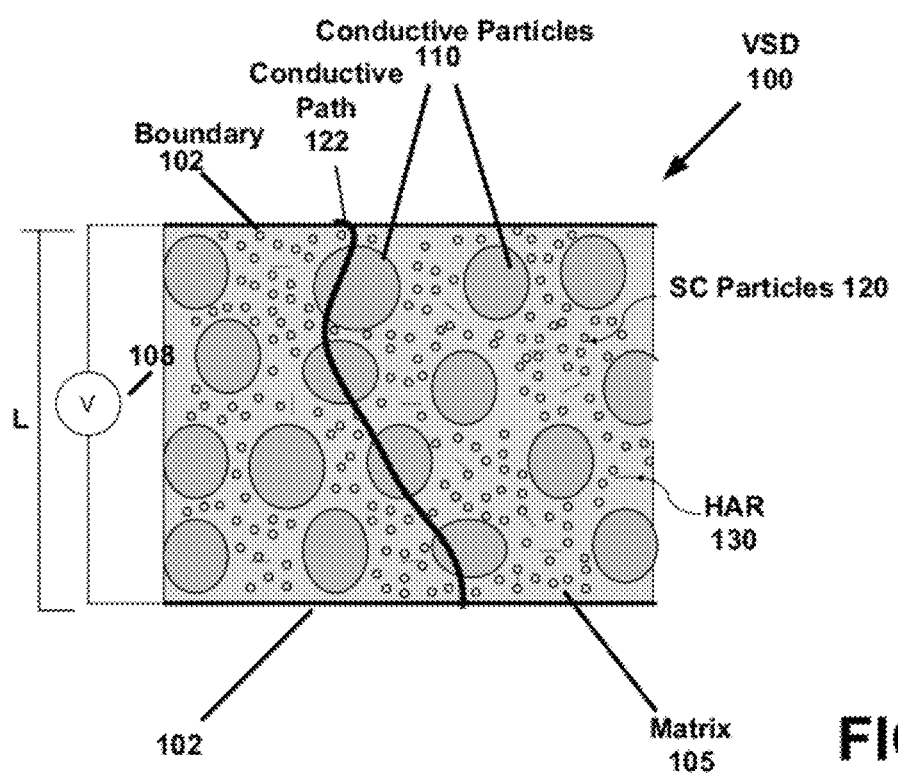
FIG. 1 is an illustrative (not to scale) sectional view of a layer or thickness of VSD material, depicting the constituents of VSD material in accordance with various embodiments.

Embodiments described herein pertain to substrate devices and packages that embed layer(s) of voltage switchable dielectric (VSD) material in a vertical switching configuration.

According to an embodiment, a substrate device includes an embedded layer of VSD material that overlays a conductive element or layer to provide a ground. An electrode, connected to circuit elements that are to be protected, extends into the thickness of the substrate to make contact with the VSD layer. When the circuit elements are operated under normal voltages, the VSD layer is non-conductive, and the first electrode is not connected to ground. When a transient electrical event occurs on the circuit elements, the VSD layer switches instantly to a conductive state, so that the first electrode is connected to ground. The configuration protects the circuit elements and connected devices that connect to the first electrode from the transient electrical event.

According to an embodiment, a substrate device vertically spaces two electrodes from one another, with a first one of the electrodes connecting to circuit elements and devices that are to be protected, and a second one of the electrodes connecting to ground. A layer of VSD material is positioned over the second electrode, and overlaid by electrically isolative material (i.e. prepreg or B-stage resin). The electrically isolative material may be characterized as material having a high dielectric constant. According to an embodiment, the first electrode extends vertically through the layer of dielectric so as to make contact with VSD material.

Still further, embodiments provide that the first electrode is structured to extend into the dielectric layer to reach the VSD material with precision depth drilling. An embodiment provides for use of a laser to create an opening from which the first electrode is formed.

A configuration such as formed enables VSD material to be vertically switched, in order to electrically connect the first electrode and the second electrode (which is grounded) during an electrical transient event.

Still further, in another embodiment, a substrate device is provided that includes a first electrode and a grounding plane or other electrode. The first electrode and the grounding plane are separated by a thickness that defines a vertical dimension. A layer of VSD material is provided over, or in at least partial contact with the second electrode, so as to be embedded in the thickness. The VSD material is triggerable to switch from a dielectric state into a conductive state with application of energy (voltage or current) that exceeds a designated threshold level. A grounding path may extend in the vertical dimension from at least the first electrode to the grounding plane.

The grounding path includes at least a thickness of the layer of VSD material. The grounding path is only electrically conductive or active in presence of a transient electrical event that supplies energy in excess of the designated threshold of the VSD material.

Still further, embodiments described herein recognize, that in the context of a substrate device, a laser may be used to form a hole or opening that extends from an electrode layer through an interior thickness of electrically isolative material (e.g. prepreg) and into an embedded layer of VSD material. In particular, one or more embodiments recognize that a laser (e.g. YAG laser) may be used to drill a hole that touches the embedded layer of VSD material without degradation of the VSD material or other unwanted effects from the use of the laser. Such a laser may be tuned to precisely detect the transition from electrically isolative material to VSD material, so as to create the opening or hole without removing any significant quantity of VSD material. In one embodiment, the layer of VSD material that underlies the opening formed by the laser has a thickness that is substantially the same as its thickness prior to the formation of the opening.

As used herein, the term 'substantially' means within 99% of a stated amount.

As used herein, the term "programmatically" means through execution of code or instructions, as performed by a processor, computer, or processing resource (e.g. processor or integrated circuits).

Voltage Switchable Dielectric (VSD) Material

As used herein, "voltage switchable material" or "VSD material" is any composition, or combination of compositions, that has a characteristic of being dielectric or non-conductive, unless a field or voltage is applied to the material that exceeds a characteristic level of the material, in which case the material becomes conductive. Thus, VSD material is a dielectric unless voltage (or field) exceeding the characteristic level (e.g. such as provided by ESD events) is applied to the material, in which case the VSD material is switched into a conductive state. VSD material can further be characterized as a nonlinear resistance material. In many applications, the characteristic voltage of VSD material ranges in values that exceed the operational voltage levels of the circuit or device several times over. Such voltage levels may be of the order of transient conditions, such as produced by electrostatic discharge, although embodiments may include use of planned electrical events. Furthermore, one or more embodiments provide that in the absence of the voltage exceeding the characteristic voltage, the material behaves similar to the binder (i.e. it is non-conductive or dielectric).

Still further, an embodiment provides that VSD material may be characterized as material comprising a binder mixed in part with conductor or semi-conductor particles. In the absence of voltage exceeding a characteristic voltage level, the material as a whole adapts the dielectric characteristic of the binder. With application of voltage exceeding the characteristic level, the material as a whole adapts conductive characteristics.

According to embodiments described herein, the constituents of VSD material may be uniformly mixed into a binder or polymer matrix. In one embodiment, the mixture is dispersed at nanoscale, meaning the particles that comprise the conductive/semi-conductive material are nano-scale in at least one dimension (e.g. cross-section) and a substantial number of the particles that comprise the overall dispersed quantity in the volume are individually separated (so as to not be agglomerated or compacted together).

Still further, an electronic device may be provided with VSD material in accordance with any of the embodiments described herein. Such electrical devices may include substrate devices, such as printed circuit boards, semiconductor packages, discrete devices, thin-film electronics, Light Emitting Diodes (LEDs), radio-frequency (RF) components, and display devices.

Some compositions of VSD materials work by loading conductive and/or semiconductive materials into a polymer binder in an amount that is just below percolation. Percolation may correspond to a statistically defined threshold by which there is a continuous conduction path when a relatively low voltage is applied. Other materials insulative or semiconductive materials may be added to better control the percolation threshold. Still further, some embodiments may compose VSD material from varistor particles dispersed in a polymer resin.

FIG. 1 is an illustrative (not to scale) sectional view of a layer or thickness of VSD material, depicting the constituents of VSD material in accordance with various embodiments. As depicted, VSD material 100 includes matrix binder 105 and various types of particle constituents, dispersed in the binder in various concentrations. The particle constituents of the VSD material may include metal particles 110, semiconductor particles 120, and high-aspect ratio (HAR) particles 130. It should be noted that the type of particle constituent that are included in the VSD composition may vary, depending on the desired electrical and physical characteristics of the VSD material. For example, some VSD compositions may include metal particles 110, but not semiconductive particles 120 and/or HAR particles 130. Still further, other embodiments may omit use of conductive particles 110.

Examples for matrix binder 105 include polyethylenes, silicones, acrylates, polymides, polyurethanes, epoxies, polyamides, polycarbonates, polysulfones, polyketones, and copolymers, and/or blends thereof.

Examples of conductive materials 110 include metals such as copper, aluminum, nickel, silver, gold, titanium, stainless steel, chrome, other metal alloys, or conductive ceramics like titanium diboride. Examples of semiconductive material 120 include both organic and inorganic semiconductors. Some inorganic semiconductors include, silicon carbide, boron nitride, aluminum nitride, nickel oxide, zinc oxide, zinc sulfide, bismuth oxide, titanium dioxide, cerium oxide, bismuth oxide, tin oxide, indium tin oxide, antimony tin oxide, and iron oxide. The specific formulation and composition may be selected for mechanical and electrical properties that best suit the particular application of the VSD material. The HAR particles 130 may be organic (e.g. carbon nanotubes, graphene) or inorganic (e.g. nano-wires or nanorods), and may be dispersed between the other particles at various concentrations. More specific examples of HAR particles 130 may correspond to conductive or semi-conductive inorganic particles, such as provided by nanowires or certain types of nanorods. Material for such particles include copper, nickel, gold, silver, cobalt, zinc oxide, tin oxide, silicon carbide, gallium arsenide, aluminum oxide, aluminum nitride, titanium dioxide, antimony, boron nitride, tin oxide, indium tin oxide, indium zinc oxide, bismuth oxide, cerium oxide, and antimony zinc oxide.

The dispersion of the various classes of particles in the matrix 105 may be such that the VSD material 100 is non-layered and uniform in its composition, while exhibiting electrical characteristics of voltage switchable dielectric material. Generally, the characteristic voltage of VSD material is measured at volts/length (e.g. per 5 mil), although other field measurements may be used as an alternative to voltage.

Accordingly, a voltage 108 applied across the boundaries 102 of the VSD material layer may switch the VSD material 100 into a conductive state if the voltage exceeds the characteristic voltage for the gap distance L. In the conductive state, the matrix composite (comprising matrix binder 105 and particles constituents) conducts charge (as depicted by conductive path 122) between the conductive particles 110, from one boundary of VSD material to the other. One or more embodiments provide that VSD material has a characteristic voltage level that exceeds that of an operating circuit. As mentioned, other characteristic field measurements may be used.

Specific compositions and techniques by which organic and/or HAR particles are incorporated into the composition of VSD material is described in U.S. patent application Ser. No. 11/829,946, entitled VOLTAGE SWITCHABLE DIELECTRIC MATERIAL HAVING CONDUCTIVE OR SEMI-CONDUCTIVE ORGANIC MATERIAL; and U.S. patent application Ser. No. 11/829,948, entitled VOLTAGE SWITCHABLE DIELECTRIC MATERIAL HAVING HIGH ASPECT RATIO PARTICLES; both of the aforementioned patent applications are incorporated by reference in their respective entirety by this application.

In an embodiment in which VSD material is formed from varistor particles dispersed in a polymer resin, metal oxide varistors may be formed using Bi, Cr, Co, Mn, and Sb. The composition may be formed using doped ZnO powder that is sintered at 800 C to 1300 C, although other temperature ranges may be used. The sintering results in electrical particles having electrical conductivity which changes as a nonlinear function against applied electrical field.

Vertical Switching with Embedded VSD Material

One manner in utilizing VSD material is to embed the VSD material as a layer on a substrate device. The layer VSD material is positioned to electrically interconnect a circuit element of the substrate with a ground element with occurrence of a transient electrical event that exceeds the characteristic threshold of the VSD material. The substrate device may integrate the layer of VSD material in order to enable the layer to switch (to conductive state) vertically or horizontally.

Figure 2A:
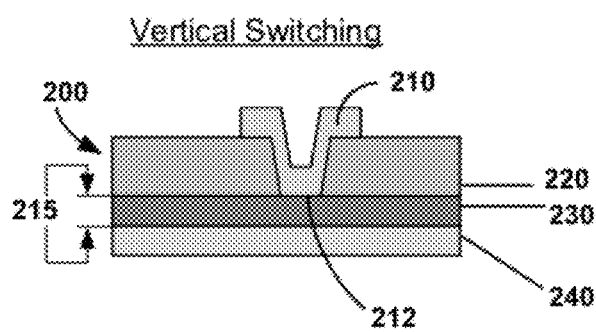
FIG. 2A illustrate a substrate device having an embedded layer of VSD material that is positioned on the substrate to switch vertically, according to an embodiment.

FIG. 2A illustrate a substrate device having an embedded layer of VSD material that is positioned on the substrate to switch vertically, according to an embodiment. With reference to FIG. 2A, the substrate device 200 includes a first electrode 210, a layer of electrically isolative material 220, a layer of VSD material 230, and a second electrode 240. The electrically isolative material may correspond to, for example, prepreg, B-stage resin, a polyimide (or a high dielectric constant material). As a specific example, the electrically isolative layer may correspond or include epoxy impregnated glass cloth. The first electrode 210 extends a depth into the layer 220, so that a portion 212 of the electrode is in physical contact with the layer of VSD material 230. The second electrode 240 may also be embedded or provided on an underside of the substrate device. The second electrode 240 is connected to ground.

The use of electrically isolative material 220 such as prepreg enables larger portions of the substrate to be interconnected and extended to a common grounding plane. Among other benefits, prepreg and other electrically isolative material enables circuit elements to be routed and traced without electrical interference. In the context of embodiments described herein, the electrically isolative material 220 enables the surface electrodes (as exemplified by first electrode 210) to be routed to the grounding plane with minimal leakage current, coupling or other electrical interference.

According to an embodiment, the first electrode 210 is electrically connected on the substrate device to a circuit, component or region that is to be protected from transient electrical events. The first electrode 210 is separated from the second electrode 240 by a gap 215 that is corresponds to at least a significant portion (e.g. 80%) of the thickness of the VSD layer 230 (extended beyond the portion that underlies the first electrode 210). In an embodiment, the first electrode 210 (i) is formed after the layer of VSD material is deposited, (ii) extended to the layer of VSD material without affecting the thickness of the VSD material in any measurable amount or significance. For example, the gap 215 separating the first and second electrodes 210, 240 may be dimensioned to be more than 99% of the thickness of the layer of VSD material 230 before the formation of the first electrode 210. However, as depicted by an embodiment of FIG. 7, the gap 215 may be formed to have dimensions that are less than the thickness of the VSD material without intrusion from the first electrode 210. For example, gap 215 may occupy, 25%, 50% or 75% of the thickness of the VSD material adjacent to the intrusion of the first electrode 210.

When a transient electrical event occurs, the first electrode 210 carries current from the event vertically to the layer of VSD material 230, so as to cause the VSD material to instantly switch into the conductive state. The VSD material switches vertically across gap 215 to electrically connect the first electrode 210 and the second electrode (ground). In this way, the first electrode 210 and the second electrode 240 are electrically interconnected, and the second electrode is connected to a grounding plane or element so as to enable the transient event to be grounded.

Figure 2B:
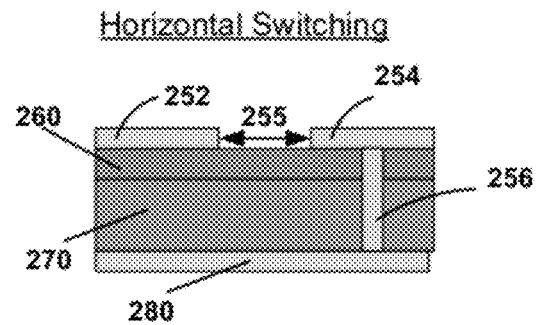
FIG. 2B illustrates a lateral switching alignment for a substrate device.

As a comparison to an embodiment such as shown by FIG. 2A, FIG. 2B illustrates a lateral switching alignment for a substrate device. In a typical configuration, conductive elements, including a first electrode 252 and a second electrode 254 are positioned above a layer of VSD material 260. A lateral gap 255 is formed, typically by removing conductive elements from the layer using etching or other processes. If prepreg or other electrically isolative material 270 is to be used, the VSD material 260 is typically overlaid on the prepreg. Another layer of conductive material 280 may extend a grounding path to the second electrode 254 through a via 256 or other electrical interconnect. When the transient electrical event occurs, a portion of the VSD material 260 extending between the first and second conductive elements is switched into the conductive state, so as to electrically interconnect the first electrode 252 to the grounding path that is provided by the second electrode 254.

An embodiment such as shown by FIG. 2A offers numerous advantages over a lateral switching alignment such as depicted in FIG. 2A. In a lateral switching configuration, the gap 255 is formed by processes (e.g. etching) that have relatively high tolerances. As such, the gap 255 is difficult to form, particular to specific tolerances or measurements. Embodiments recognize that the gap 255 is the critical dimension for when the VSD material switches. Variations in the gap 255 affect the clamp/trigger voltage required to switch the layer of VSD material 260. As a dimension for lateral switching, the dimension is very difficult to control during manufacturing, particularly for small gap sizes.

Furthermore, the planar geometric configuration shown in FIG. 2B promotes a non-uniform electric field distribution that causes potential local and high field concentration, particularly at the edge of the electrodes. Such non-uniformity can make the trigger/clamp voltage of the VSD material higher than a comparable vertical gap/switching arrangement.

Figure 7:
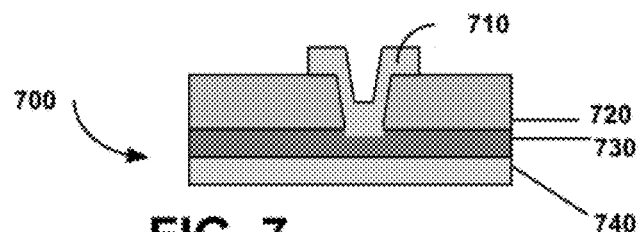
FIG. 7 illustrates a variation to an embodiment shown in FIG. 2A.

While an embodiment of FIG. 2A depicts a low tolerance gap formation for enabling VSD switching between two vertically separated electrodes, embodiments recognize that the gap formation does not have to be as precise as depicted in FIG. 2A. For example, an embodiment of FIG. 7 depicts a configuration in which the first electrode extends some depth into the layer of VSD material.

Vertical Structure Formation

Figure 3A:
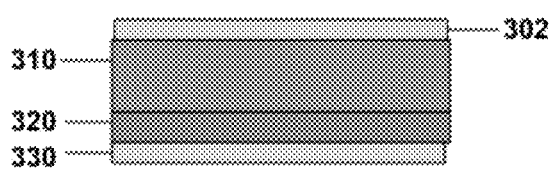
FIG. 3A through FIG. 3C depict a process or technique for creating a substrate device such as shown and depicted by an embodiment of FIG. 2A.
Figure 3B:
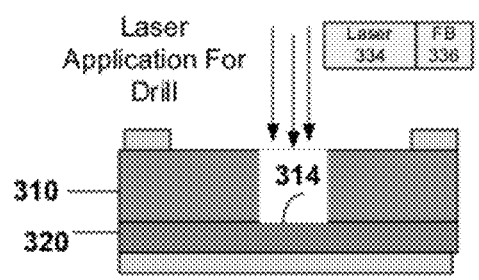
Figure 3C:
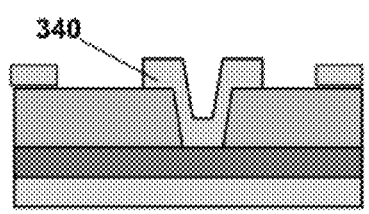

FIG. 3A through FIG. 3C depict a process or technique for creating a substrate device such as shown and depicted by an embodiment of FIG. 2A.

In FIG. 3A, a multi-layered substrate device is formed that includes a layer of conductive material (e.g. copper). a layer of electrically isolative material 310, a layer of VSD material 320, and a conductive layer for providing ground 330. The formation of the substrate device in this stage may be referred to as a stack or stacked structure.

In FIG. 3B, an opening 314 is formed that extends through the electrically isolative material 310 and to the layer of VSD material 320. The opening 314 may be referred to as a microvia. The opening 314 may be precision formed, at least in the depth dimension, so that the formation of the opening stops at the VSD material 320. In one embodiment, the opening is drilled with a laser 334. The opening 314 may be formed as part of a process or series of processes that include printing, etching (conductive material) and drilling (including laser or precision drilling). In forming the opening, a YAG laser may be used to provide precision depth to the top layer or surface of the layer of VSD material. A YAG laser may include a mechanism 336 that enables it to automatically precision depth drill opening 114. In one embodiment, the amount of time/power in which the laser is needed to precision depth through the electrically isolative material may be a known parameter. Still further, an implementation may list or associate (e.g. via a table) power and time of operation of the laser with drill depth for a specific type of prepreg (or other electrically isolative material). With this information, the laser may be operated for a duration and power level to drill opening 114 to precisely reach VSD material. In some implementations, a process may be performed where the drilling is stopped to measure the depth of opening 114. Such a stop and go process may protect against, for example drilling beyond the transition line from prepreg to VSD material. In addition to precision depth drilling, the use of the laser also enables precession lateral drilling the X and Y directions.

In another embodiment, the laser 334 may be operated with an optional feedback mechanism 336, such as an optical sensor that detects the presence of VSD material at the bottom of the opening 314. Once the VSD material is detected, the laser drilling is stopped. In such an embodiment, the laser 334 may be configured with an integrated or separate component that is configured to programmatically detect the presence of the layer of VSD material 320, and more specifically, the transition from the dielectric thickness of the electrically isolative material 310 to the VSD material layer 320. The feedback mechanism 336 may incorporate processor(s) in combination with other resources such as memory, in order to evaluate characteristics pertaining to the output of the laser, and or optical characteristics of the material being drilled, in order to detect the transition to VSD material 320. Alternatively, the feedback mechanism 336 may be implemented with processing resources (such as firmware or hardware logic, including circuitry).

According to one or more embodiments, the use of the laser drill enables the opening 314 to reach the layer of VSD material 320 without removing any significant amount of material from that layer. In an embodiment, the laser removes less than 1% of the layer of VSD material. Embodiments further recognize that the laser can be controlled in lasing the prepreg (or other electrically isolative material) in depth to a tolerance of less than 100 angstroms, and even less than 10 angstroms.

FIG. 3C provides that the electrode 340 of the substrate device is formed over the opening 314. In an embodiment, the opening 314 is plated or otherwise provided with conductive material to form the electrode 340. The conductive material may line the walls or other vertical dimension of the opening 314.

Embodiments such as described with FIG. 2A and elsewhere in the application provide several benefits over more conventional approaches for providing vertical switching using VSD material. For example, while some past approaches have included layers of VSD material 320, those approaches have not used drilled holes or similar structures to provide the desired formation of the conductive opening. Drilling, including laser-drilling, enables more precision and tightly spaced gaps or thicknesses than etching, for example. As such, spacing or tolerance levels and dimensions in a structure such as shown and described with FIG. 1 may be tighter than those offered under many conventional approaches.

Moreover, past approaches for providing vertical switching of VSD material have not accounted for use of additional layers, such as prepreg or other electrically isolative material 310. Embodiments described herein provide for implementation of the VSD material into (or onto) various layers in the substrate device.

Still further, as compared to the conventional approaches, the use of embedded VSD material with vertical switching configuration enables a lower "turn on" or clamping voltages than that which can be reliably obtained from a conventional approach such as shown with FIG. 2B. As mentioned, this is because the vertical thickness (which is the electrode "gap" in an embodiment of FIG. 3C) can be more precisely controlled to smaller dimensions than printed circuit board and substrate manufacturing process (e.g. such as provided from etching).

According to an embodiment, a structure such as depicted by FIG. 3C (or alternatively by FIG. 2A) is capable of complete ESD protection for any net, pin, and pad on any circuit by simply providing one or more openings or micro via (uvia) that reach the layer of VSD material. In contrast, a horizontal switching orientation such as described with FIG. 2B only protects nets, pins, or pads that pass through the VSD material. In the horizontal switching orientation, many (e.g. 80%) of the pins on a conventional PCB would be left unprotected.

Figure 4:
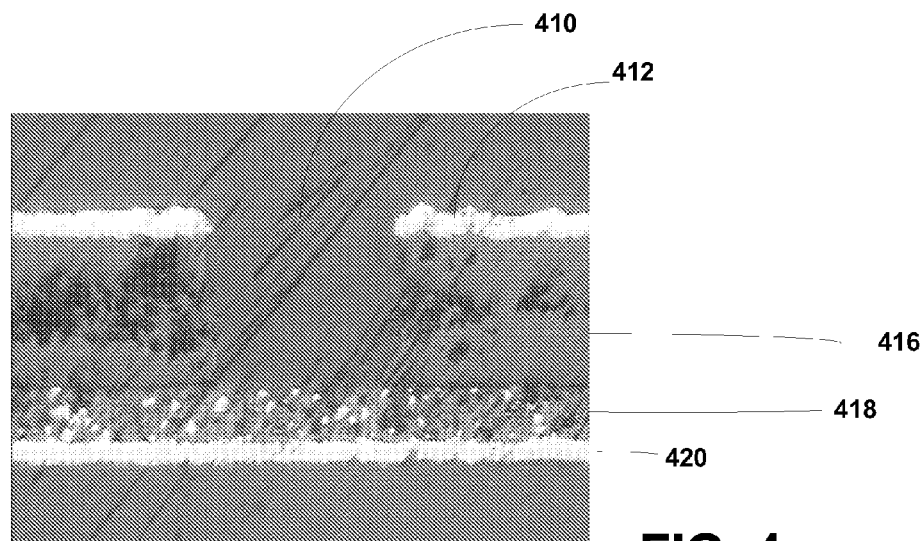
FIG. 4 illustrates an actual laser drilled hole for opening 314, under an embodiment.

FIG. 4 illustrates an actual laser drilled hole for opening 314, under an embodiment. The hole 414 may be drilled using a commercially available laser; such as an Excimer, YAG, or CO2 laser. Embodiments recognize that the laser may be selected based on the properties of the VSD material, for example, a CO2 laser could light scatter and is unable to safely drill for a given type of VSD material. However, a YAG laser for the same VSD material can readily create the hole 414, which penetrates an outer electrode 412 and the prepreg (or other electrically isolative material) 416. The opening 410 may extend to reach the VSD material layer 418, which is in contact or overlaid onto the second electrode 420. But as mentioned with previously, the laser that creates the hole 410 can have capability to detect transition from prepreg 416 to VSD material 420. The ability to detect the transition instantly enables the hole 410 to be created to reach, but not extend into the layer of VSD material. Optionally the hole 410 may be cleaned free of loose resin by plasma or chemical etching (de-smear).

Multi-Layer Structure

Figure 5:
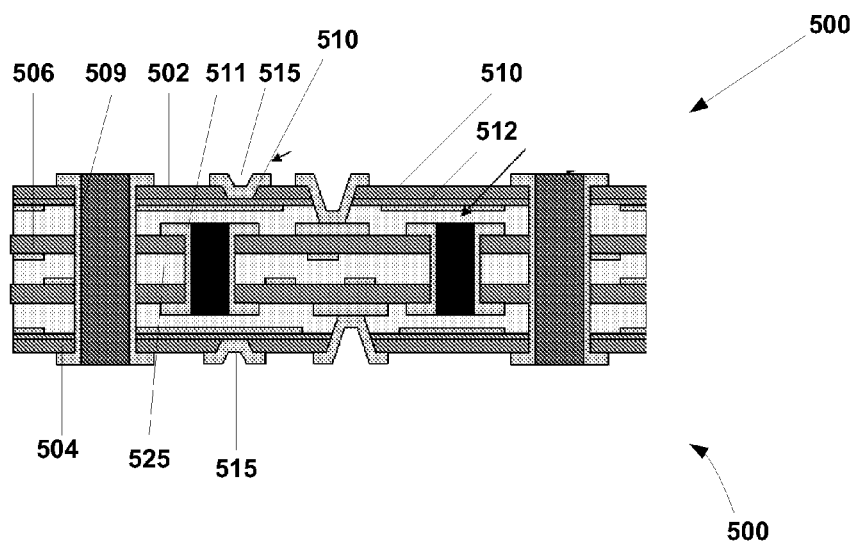
FIG. 5 shows a multi-layered printed circuit board (or other substrate device) that incorporates a vertical switching layer of VSD material, in accordance with one or more embodiments.

A substrate device configuration such as depicted in FIG. 2A can be stacked or integrated as a separate thickness within a larger substrate. FIG. 5 shows a multi-layered (8 layer) printed circuit board (or other substrate device) that incorporates a vertical switching layer of VSD material, in accordance with one or more embodiments. In a typical circuit board configuration for small electronic devices (such as cell phones), the layers are provided by a combination of laminations, drills, and plating cycles. For example, a high density interconnect (HDI) multi-layered PCB configurations can typically use a 2+4+2 or 1+1+4+1+1 Stackup which requires multiple laminations, drills, and plating cycles.

With reference to FIG. 5, core layer 502 overlays VSD material 510 on both sides of the substrate 500. The VSD material 510 is formed to be adjacent to the ground plane 512 on both sides of the PCB. Additional core layers 504, 506 are provided within the substrate 500. Each core layer 502, 504, 506 includes conductive materials on one or both sides. Layers of electrically isolative material 525 may be distributed between the core layers.

The substrate 500 may include different types of vias, including (i) thru vias 509 that extend through the thickness of the entire substrate, in order to electrically connect elements on each exterior side of the substrate; (ii) buried vias 511 that electrically interconnect elements of two or more interior core layers; and (iii) micro-vias 515, which are laser drilled to extend one or more conductive layers to VSD material for ground protection. For example, an electrode 521 is formed over an opening that is extended to the upper layer of VSD material 510, to separate that electrode from the grounding plane 512 that underlies the layer of VSD material. Some conductive elements may be drilled through the VSD material to interconnect elements of an exterior core with one of an interior core layer. Numerous other variations are also possible.

With reference to electrode 521, for example, by laser drilling with a YAG laser (i.e. Excellon Cobra) then plating, connection can be made from the outer layer to the VSD material layer 510. The VSD material "turn on" voltage (or energy) is characterized by the VSD material formulation and VSD layer thickness. The composition of VSD material may be selected for a desired characteristic, including the clamping voltage. A standard electroplating, electroless plating, "build up", or pattern replication can be used to plate drilled openings, as well as other formations on the layers.

With regard to an embodiment of FIG. 5 or elsewhere (e.g. FIG. 2A), the layer VSD may be either continuous or non-continuous (i.e. patterned) as it spans a given thickness of the substrate device.

Figure 6:
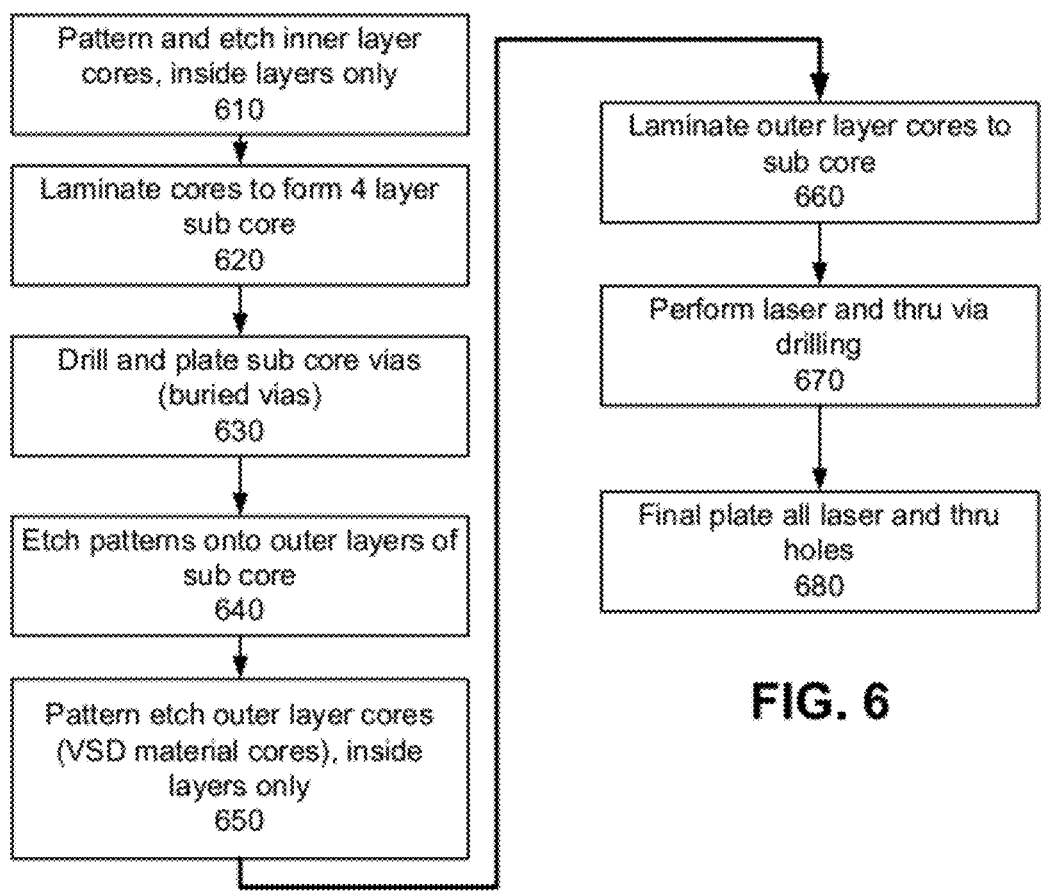
FIG. 6 illustrates a process flow of a multi-layer printed circuit board that uses an embedded layer of VSD material to provide a vertically switched protective element for transient electrical events, under an embodiment of the invention.

FIG. 6 illustrates a process flow of a multi-layer substrate device (e.g.) printed circuit board that uses an embedded layer of VSD material to provide a vertically switched protective element for transient electrical events, under an embodiment. A process flow consistent with as described in FIG. 6 may be used to implement an embodiment such as described with FIG. 5. Accordingly, reference is made to elements of FIG. 5 for purpose of illustrating suitable elements or features in relation to a step or sub-step being described. The process steps that are discussed may be varied to accommodate the formation of different kinds of multi-layer substrate device. The process may be simplified to accommodate single or double layer substrate devices, or performed with additional steps to accommodate more heavily layered substrate devices.

In step 610, the inner layer cores (L4 and L5) of the multi-layered substrate device is subjected to stand processes that include imaging and etching. Step 620 provides that the cores are laminated to form a four layer sub-core. Step 630 provides that the buried vias 511 are formed in the sub-core. Drill and plate processes may be performed to form the buried vias 515.

In step 640, patterns are etched onto the outer layers of the sub core. Next, step 650 provides that the inside layers of the outer layer cores are pattern etched. In step 660, the outer layer cores are laminated to the sub core.

In step 670, multiple drill steps are performed to form the thru vias 609 and micro-vias 515. As mentioned, the micro-vias may be formed using precision laser drilling, such as described with an embodiment of FIG. 3A through FIG. 3C.

Step 680 provides for final plating all laser and through holes. As mentioned, when the micro-vias 515 are plated, they form electrodes that intermittingly (i.e. when transient electrical conditions are present) ground the corresponding interconnected elements to the nearest grounding plane across a vertical gap thickness of the VSD material.

Many variations or alternatives to the process flow may also be incorporated in which (i) an embedded layer of VSD material (continuous or patterned) is formed and provided in contact or in connection with a grounding plane, and (ii) a conductive opening is drilled and then formed to extend to at least the VSD material.

Alternatives

While some embodiments described provide for opening or holes (that are subsequently plated or provided with electrical material) to be formed by a laser, one or more embodiments contemplate that the holes or openings may be formed by conventional mechanical drilling. For example, an embodiment of FIG. 7 illustrates a variation to an embodiment shown in FIG. 2A. In FIG. 7, the first electrode 710 extends into a thickness T of the VSD layer 230. Different implementations (such as drilling techniques) and embodiments may provide for the depth at which the first electrode 710 is extended. In some implementations, the first electrode may be extended to occupy anywhere between 10-80% of the thickness of the VSD layer 230. Mechanical drilling may be used to form the opening from which the first electrode 710 is formed, similar to a process depicted by FIG. 3A through FIG. 3C (except the mechanical drill is used in place of the laser in FIG. 3B).

Additionally, one or more embodiments provide that numerous layers of electrodes and VSD material may be provided in either continuous or non-continuous form.

As another alternative for enabling use of VSD material in a vertical switching arrangement, a "build up" process may be used to form a vertical opening into the stack to electrically contact an embedded layer of VSD material. In an embodiment, a "build up" process be used to make these structures. A photoimagable dielectric layer may be deposited in the VSD material, patterned, and then the conductor layer may be built up from the patterned dielectric layer. A pattern replication technology could also be used to pattern the dielectric layer and/or VSD material layer.

Conclusion

Although illustrative embodiments of the invention have been described in detail herein with reference to the accompanying drawings, it is to be understood that the invention is not limited to those precise embodiments. As such, many modifications and variations will be apparent to practitioners skilled in this art. Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no mentioned of the particular feature. Therefore, the absence of describing combinations should not preclude the inventor from claiming rights to such combinations.

The invention claimed is:

1. A method for forming a substrate device, the method comprising:
   forming a substrate stack comprising (i) an electrically isolative layer, (ii) voltage switchable dielectric (VSD) material that underlies the electrically isolative material, and (iii) a grounding electrode, the VSD material overlaying the grounding electrode;
   forming an opening into the electrically isolative layer without extending the opening through the layer of VSD material; and
   forming conductive material on at least a portion of the opening in order to form a first electrode that is in contact with VSD material.

2. The method of claim 1, wherein the first electrode makes surface contact with the layer of VSD material.

3. The method of claim 1, wherein the first electrode makes intermediate contact with the layer of VSD material.

4. The method of claim 1, wherein the first electrode is shaped to match an opening that is formed in the layer of electrically isolative material.

5. The method of claim 1, wherein the electrically isolative material is epoxy impregnated glass cloth.

6. The method of claim 1, wherein the electrically isolative material is a B-stage resin.

7. The method of claim 1, wherein -the electrically isolative material has a high dielectric constant.

8. The method of claim 1, wherein the electrically isolative material is a polyimide.

9. The method of claim 1, wherein forming the opening into the electrically isolative layer includes precision depth drilling the opening using a YAG laser.

10. The method of claim 1, wherein forming the opening into the electrically isolative layer includes drilling the opening.

11. The method of claim 1, wherein forming the opening into the electrically isolative layer includes laser drilling the opening.

12. The method of claim 1, wherein forming the opening into the electrically isolative layer includes precision depth drilling the opening so as to form the opening without substantially affecting a thickness of the VSD material.

13. The method of claim 9, wherein precision depth drilling the opening includes using a feedback component to detect transition in drilling from the electrically isolative layer to the VSD material.

* * * * *